United States Patent
Tokioka et al.

(10) Patent No.: US 9,946,332 B2
(45) Date of Patent: Apr. 17, 2018

(54) SEMICONDUCTOR DEVICE WITH POWER ON RESET CIRCUITRY

(71) Applicant: RENESAS ELECTRONICS CORPORATION, Tokyo (JP)

(72) Inventors: Yoshinori Tokioka, Tokyo (JP); Soichi Kobayashi, Tokyo (JP); Akira Oizumi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/439,175

(22) Filed: Feb. 22, 2017

(65) Prior Publication Data

US 2017/0160792 A1 Jun. 8, 2017

Related U.S. Application Data

(63) Continuation of application No. 14/845,060, filed on Sep. 3, 2015, now Pat. No. 9,612,644, which is a
(Continued)

(30) Foreign Application Priority Data

Sep. 25, 2012 (JP) ................. 2012-210941

(51) Int. Cl.
*G06F 1/32* (2006.01)
*G06F 1/24* (2006.01)
(52) U.S. Cl.
CPC .............. *G06F 1/3296* (2013.01); *G06F 1/24* (2013.01)
(58) Field of Classification Search
CPC .................. G06F 1/24; G06F 1/3296
(Continued)

(56) References Cited

U.S. PATENT DOCUMENTS

| 7,372,309 B2 | 5/2008 | Ohtake |
| 7,403,051 B1 | 7/2008 | Lesea |
| 2011/0025365 A1* | 2/2011 | Waser ................ G01R 31/3163 324/762.01 |

FOREIGN PATENT DOCUMENTS

| CN | 1790907 A | 6/2006 |
| JP | 6-96238 A | 4/1994 |

(Continued)

OTHER PUBLICATIONS

Office Action U.S. Appl. No. 14/036,781 dated Jan. 26, 2015.
(Continued)

*Primary Examiner* — John Poos
(74) *Attorney, Agent, or Firm* — McDermott Will & Emery LLP

(57) ABSTRACT

A semiconductor device which makes it possible to reduce a wasteful standby time at power-on is provided. In this semiconductor device, a reset of an internal circuit is canceled as described below. When a data signal stored in a storage section is at "0," the reset is canceled by bringing an internal reset signal to the "H" level when a relatively short time has passed after the rising edge of a power on reset signal. When the data signal is at "1," the reset is canceled by bringing the internal reset signal to the "H" level when a relatively long time has passed after the rising edge of the power on reset signal. Therefore, a wasteful standby time at power-on can be reduced by writing the data signal logically equivalent to the rise time of supply voltage to the storage section.

6 Claims, 9 Drawing Sheets

Related U.S. Application Data continuation of application No. 14/036,781, filed on Sep. 25, 2013, now Pat. No. 9,166,601.

(58) Field of Classification Search
USPC .......................................... 327/142, 143, 198
See application file for complete search history.

(56) References Cited

FOREIGN PATENT DOCUMENTS

| | | |
|---|---|---|
| JP | 2004-260648 A | 9/2004 |
| JP | 2007-249777 A | 9/2007 |

OTHER PUBLICATIONS

Notice of Allowance U.S. Appl. No. 14/036,781 dated May 6, 2015.
Notification of Reasons for Refusal Japanese Patent Application No. 2012-210941 dated Aug. 25, 2015 with full English translation.
Office Action issued in related U.S. Appl. No. 14/845,060, dated Feb. 4, 2016.
Office Action issued in related U.S. Appl. No. 14/845,060, dated Jul. 29, 2016.
Notice of Allowance issued in related U.S. Appl. No. 14/845,060, dated Nov. 23, 2016.
Office Action issued in corresponding Chinese Patent Application No. 201310438120.5, dated Sep. 28, 2017.

* cited by examiner

SEMICONDUCTOR DEVICE WITH POWER ON RESET CIRCUITRY

CROSS-REFERENCE TO RELATED APPLICATIONS

This Application is a Continuation Application of U.S. Ser. No. 14/845,060 filed Sep. 3, 2015, which is a Continuation Application of U.S. Ser. No. 14/036,781 filed Sep. 25, 2013, which claims priority to Japanese Patent Application No. 2012-210941 filed Sep. 25, 2012. The subject matter of each is incorporated herein by reference in entirety.

BACKGROUND

The present invention relates to a semiconductor device and is preferably applicable to, for example, a semiconductor device incorporating a power on reset circuit.

Patent Document 1 discloses a reset circuit including a voltage fluctuation detection circuit and a voltage monitoring timer circuit. When supply voltage is turned on, the voltage fluctuation detection circuit outputs a voltage fluctuation signal in response to the arrival of the supply voltage at a threshold voltage. The voltage monitoring timer circuit is reset by a voltage fluctuation signal and expires when a certain time has passed. The reset circuit resets a microcomputer during a standby period from when the voltage monitoring timer circuit is reset to when it expires.

Patent Document 2 discloses a voltage detection circuit, a reset circuit, and a delay circuit including a counter circuit. When supply voltage takes a normal value, the voltage detection circuit outputs a voltage detection signal; after it carries out a predetermined counting operation through the counter circuit, it outputs a count up signal. The reset circuit outputs a reset canceling signal in response to the output of the count up signal.

[Patent Document 1] Japanese Unexamined Patent Publication No. 2007-249777

[Patent Document 2] Japanese Unexamined Patent Publication No. Hei 06(1994)-096238

SUMMARY

The reason why the voltage monitoring timer is provided in the technology in Patent Document 1 is to cancel a reset to operate the microcomputer after supply voltage arrives at the operation lower-limit voltage of the microcomputer. However, the rise time after supply voltage exceeds a threshold voltage before it arrives at a rated voltage varies depending on the type of the power supply or the like. When a rise time is shorter than a standby time, the start of operation of the microcomputer is delayed and the power consumption is increased.

Other objects and novel features of the invention will be apparent from the description of this specification and the accompanying drawings.

According to an embodiment, the following is carried out in the semiconductor device of this invention: the falling edge of a power on reset signal is delayed by a delay time set by a setting section to generate an internal reset signal and an internal circuit is reset by this internal reset signal.

According to an embodiment, the timing with which a reset of an internal circuit is canceled can be adjusted; therefore, it is possible to shorten the wasteful standby time of the internal circuit and reduce the power consumption.

DETAILED DESCRIPTION

First Embodiment

Figure 1:
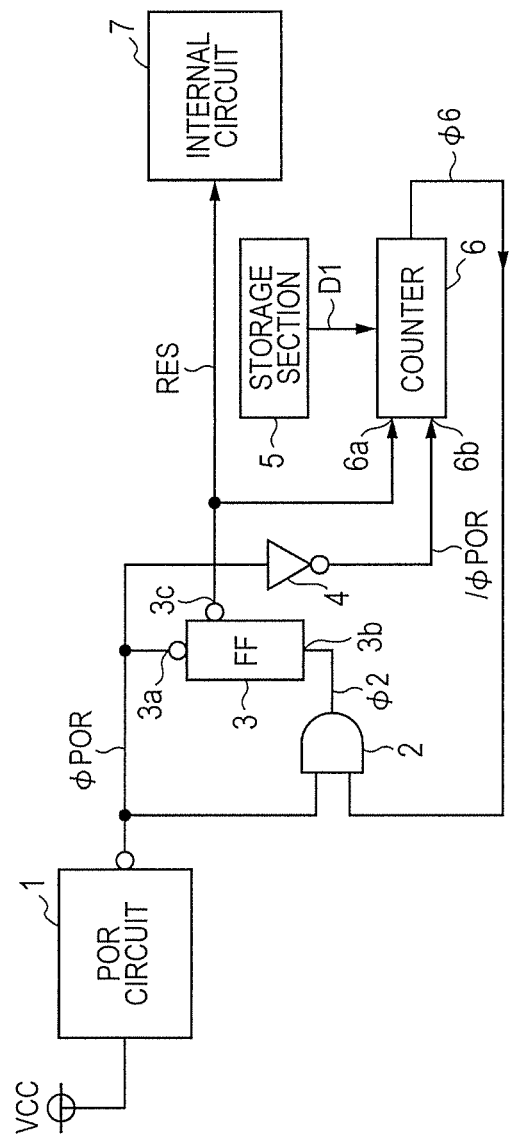
FIG. 1 is a circuit block diagram illustrating a principal part of a semiconductor device in a first embodiment of the invention.

As illustrated in FIG. 1, a semiconductor device in the first embodiment of the invention includes: a POR (Power On Reset) circuit 1, an AND gate 2, a flip flop (FF) 3, an inverter 4, a storage section 5, a counter 6, and an internal circuit 7.

The POR circuit 1 brings a power on reset signal ØPOR to the "L" level, or the activation level, in response to turn-on of supply voltage VCC; it brings the power on reset signal ØPOR to the "H" level, or the deactivation level, in response to arrival of the supply voltage VCC at a threshold voltage VT1. The power on reset signal ØPOR is supplied to one input terminal of the AND gate 2 and is supplied to the set terminal 3a of the flip flop 3; it is inverted by the inverter 4 and is supplied to the reset terminal 6b of the counter 6.

The AND gate 2 receives the power on reset signal ØPOR and the output signal Ø6 of the counter 6 and supplies the logical multiplication signal Ø2 of the signals to the reset terminal 3b of the flip flop 3. The flip flop 3 is set in response to the power on reset signal ØPOR being brought to the "L" level, or the activation level and brings an internal reset signal RES to the "L" level, or the activation level. The flip flop 3 is reset in response to the output signal Ø2 of the AND gate 2 being brought to the "H" level, or the activation level and brings the internal reset signal RES to the "H" level, or the deactivation level.

The storage section 5 includes a flash memory from which data can be read even when the supply voltage VCC is lower than the threshold voltage VT1 and supplies a data signal D1 to the counter 6. When the rise time of the supply voltage VCC is short, the data signal D1 is brought to, for example, "0" (ground voltage VSS); when the rise time of the supply voltage VCC is long, the data signal D1 is brought to, for example, "1" (supply voltage VCC). The rise time of supply voltage VCC refers to a time required for the supply voltage VCC to reach the rated voltage VR after the supply voltage VCC is turned on. The rise time of supply voltage VCC is determined by the current supply capability of a power supply that supplies the supply voltage VCC to the semiconductor device and other like factors.

A user of the semiconductor device writes a data signal D1 of "0" or "1" to the storage section 5 in accordance with the configuration of a system incorporating the semiconductor device. Instead of the flash memory, an externally cuttable fuse may be provided in the storage section 5 and the data signal D1 may be generated according to whether or not the fuse is cut. A circuit that carries out, for example, the following processing may be provided in the storage section 5: when the fuse is cut, the circuit outputs ground voltage VSS indicating that the data signal D1 is at "0"; and when the fuse is not cut, the circuit outputs supply voltage VCC indicating that the data signal D1 is at "1." An external terminal for supplying the data signal D1 to the counter 6 may be provided. The storage section 5 comprises a setting section.

The maximum value CM of the count value C on the counter 6 is changed according to the data signal D1. When the data signal D1 is at "0," the maximum value CM of the count value C is a relatively small value CML; when the data signal D1 is at "1," the maximum value CM of the count value C is relatively large value CMH (CML<CMH).

When the inverted signal /ØPOR of the power on reset signal ØPOR supplied to the reset terminal 6b is at the "H" level, the count value C on the counter 6 is reset and fixed to the initial value. That is, when the power on reset signal ØPOR is at the "L" level, the count value C is reset and fixed to the initial value. When the power on reset signal ØPOR is brought to the "H" level, the reset of the count value C is canceled and the counting operation of the counter 6 is started.

When the internal reset signal RES supplied to the stop terminal 6a is at the "H" level, the counting operation of the counter 6 is stopped. When the internal reset signal RES is brought to the "L" level, the counting operation of the counter 6 is enabled.

Therefore, the counter 6 starts to count the number of pulses of a clock signal (not shown) in response to the power on reset signal ØPOR being raised from the "L" level to the "H" level. The counter 6 raises the signal Ø6 from the "L" level to the "H" level to stop counting in response to the arrival of its count value C at the maximum value CML or CMH.

The signal Ø6 is brought to the "H" level, the output signal Ø2 of the AND gate 2 is raised from the "L" level to the "H" level. As a result, the flip flop 3 is reset and the internal reset signal RES is raised to the "H" level, or the deactivation level.

The internal circuit 7 is a logic circuit such as, for example, the central processing unit of a microcomputer. The internal circuit is reset to the initial state during a period for which the internal reset signal RES is at the "L" level and starts operation in response to the internal reset signal RES being brought from the "L" level to the "H" level.

Figure 2:
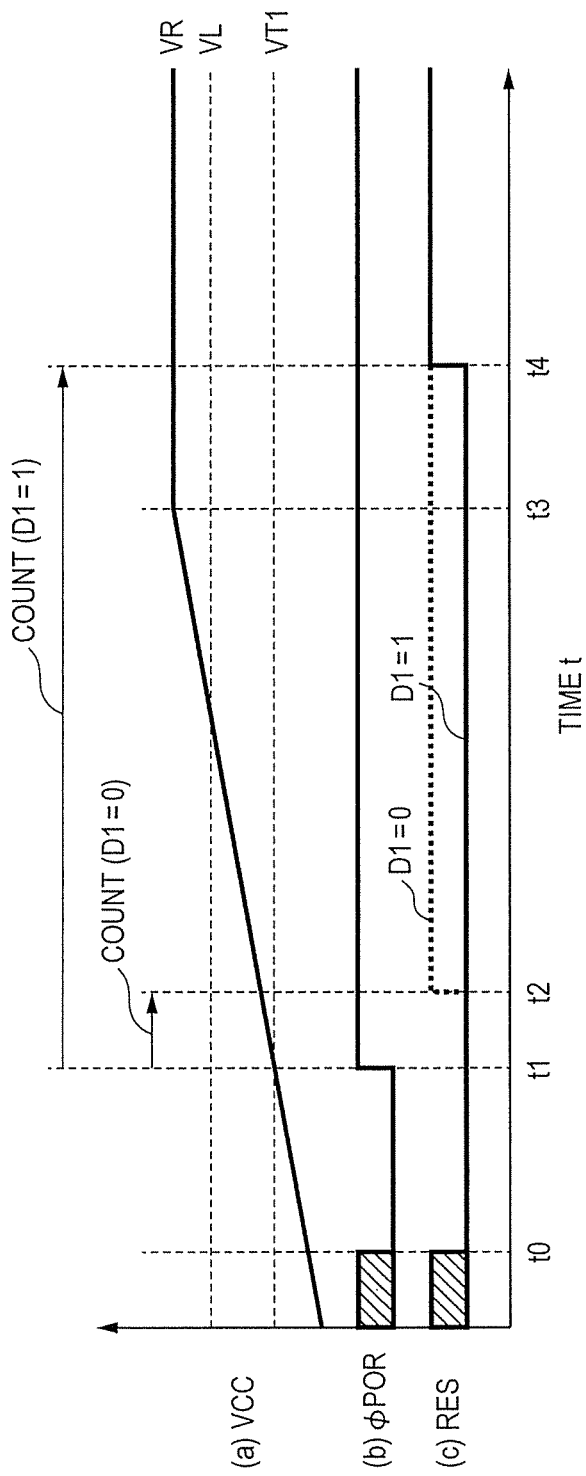
FIG. 2 is a time chart indicating the operation of the semiconductor device illustrated in FIG. 1.

In FIG. 2, (a) to (c) are a time chart indicating the operation of the semiconductor device. When the supply voltage VCC from an external power supply is turned on, the supply voltage VCC is gradually increased. When the supply voltage VCC reaches a voltage at which the operation of the POR circuit 1, flip flop 3, and the like is enabled (time t0), the power on reset signal ØPOR is brought to the "L" level, or the activation level.

When the power on reset signal ØPOR is brought to the "L" level, the flip flop 3 is set and the internal reset signal RES is brought to the "L" level, or the activation level. As a result, the internal circuit 7 is reset to the initial state and counting by the counter 6 is enabled.

When the supply voltage VCC is further increased and reaches the threshold voltage VT1 of the POR circuit 1, the power on reset signal ØPOR is raised to the "H" level, or the deactivation level, by the POR circuit 1. When the power on reset signal ØPOR is raised to the "H" level, the counter 6 starts to count. When the data signal D1 is at "0," the maximum value CM of the count value C on the counter 6 is a relatively small value CML; when the data signal D1 is at "1," it is a relatively large value CMH. The drawing indicates a case where the data signal D1 is brought to "1" since the rise time of the supply voltage VCC is long.

The supply voltage VCC is further increased and exceeds the lower limit voltage VL at which the internal circuit 7 normally operates and reaches the rated voltage VR (time t3). When the count value C on the counter 6 reaches the maximum value CMH, the signal Ø6 is brought to the "H" level. As a result, the flip flop 3 is reset and the internal reset signal RES is raised to the "H" level. When the internal reset signal RES is brought to the "H" level, the counting operation of the counter 6 is stopped and the operation of the internal circuit 7 is started.

In this case, the maximum value CMH of the count value C on the counter 6 is preset so that after the supply voltage VCC exceeds the operation lower-limit voltage VL, the count value C becomes equal to the maximum value CMH. When the rise time of the supply voltage VCC is short, the maximum value CM of the count value C is set to a small value CML and the internal reset signal RES is early raised to the "H" level (time t2).

Figure 3:
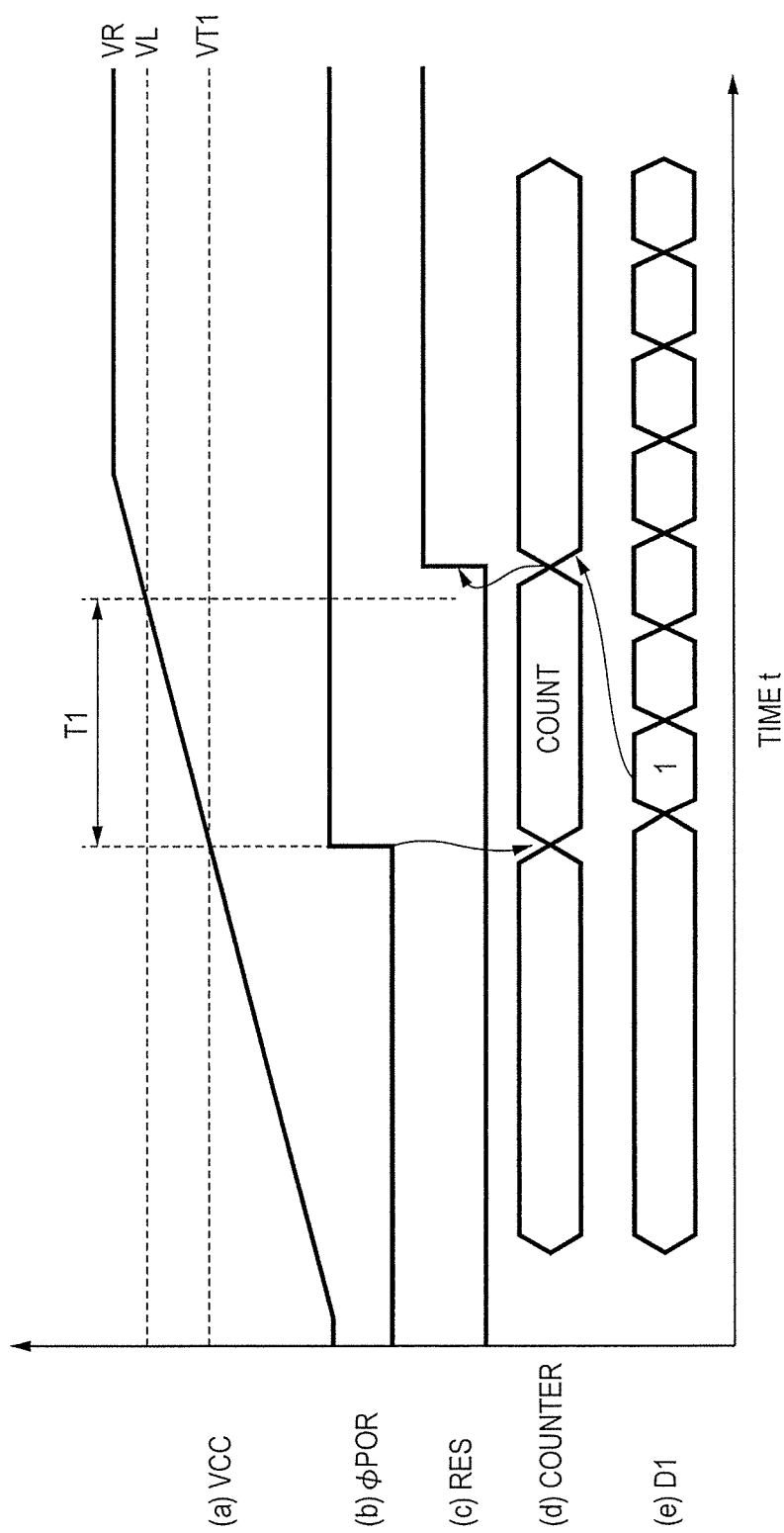
FIG. 3 is a time chart indicating the usage of the semiconductor device illustrated in FIG. 1.

In FIG. 3, (a) to (e) are a time chart indicating the usage of the semiconductor device taken when the rise time of the supply voltage VCC is relatively long. In this case, the time T1 required for the supply voltage VCC to rise from the threshold voltage VT1 of the POR circuit 1 to the operation lower-limit voltage VL of the internal circuit 7 is relatively long. However, if the internal reset signal RES is raised to the "H" level immediately after the power on reset signal ØPOR is raised to the "H" level, the following takes place: even though the supply voltage VCC is lower than the operation lower-limit voltage VL, the internal circuit 7 starts operation and the internal circuit 7 malfunctions.

To prevent this, the following measure is taken in this semiconductor device: when the data signal D1 stored in the storage section 5 is at "1," the maximum value CMH of the count value C is so set that the count time of the counter 6 is slightly longer than the above time T1. The user writes the data signal D1 of "1" to the storage section 5. Thus when a time slightly longer than the above time T1 has passed after the power on reset signal ØPOR is raised to the "H" level, the internal reset signal RES is raised to the "H" level. At this time, the supply voltage VCC is higher than the operation lower-limit voltage VL; therefore, the internal circuit 7 normally operates.

Figure 4:
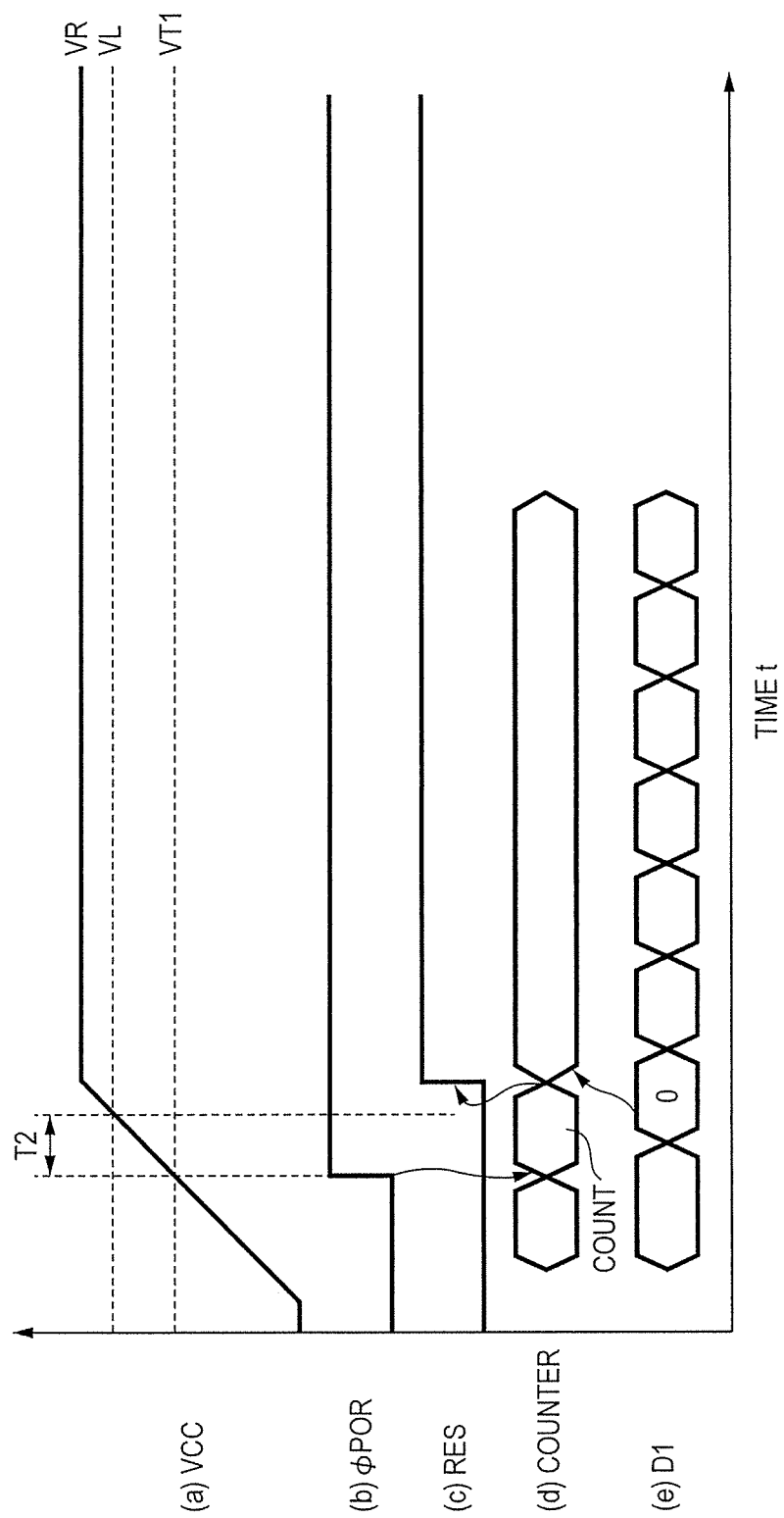
FIG. 4 is another time chart indicating the usage of the semiconductor device illustrated in FIG. 1.

In FIG. 4, (a) to (e) are a time chart indicating the usage of the semiconductor device taken when the rise time of the supply voltage VCC is relatively short. In this case, the time T2 required for the supply voltage VCC to rise from the threshold voltage VT1 of the POR circuit 1 to the operation lower-limit voltage VL of the internal circuit 7 is relatively short. However, if the internal reset signal RES is raised to the "H" level when a long time has passed after the power on reset signal ØPOR is raised to the "H" level, the following takes place: a wasteful standby time is produced in the internal circuit 7 and the power consumption is increased.

To prevent this, the following measure is taken in this semiconductor device: when the data signal D1 stored in the storage section 5 is at "0," the maximum value CML of the count value C is so set that the count time of the counter 6 is slightly longer than the above time T2. The user writes the data signal D1 of "0" to the storage section 5. Thus when a time slightly longer than the above time T2 has passed after the power on reset signal ØPOR is raised to the "H" level, the internal reset signal RES is raised to the "H" level. At this time, the supply voltage VCC is higher than the operation lower-limit voltage VL; therefore, the internal circuit 7 normally operates. Further, it is possible to shorten the wasteful standby time and reduce the power consumption.

In the first embodiment, the data signal D1 of "0" or "1" is stored in the storage section 5 so that the count time of the counter 6 can be set to either of two stages. The invention is not limited to this. The data signal D1 of multiple bits may be stored in the storage section 5 so that the count time of the counter 6 can be set to any of three or more stages. For example, the data signal D1 of 00, 01, 10, or 11 may be stored in the storage section 5 so that the count value of the counter 6 can be set to any of the four stages.

Figure 5:
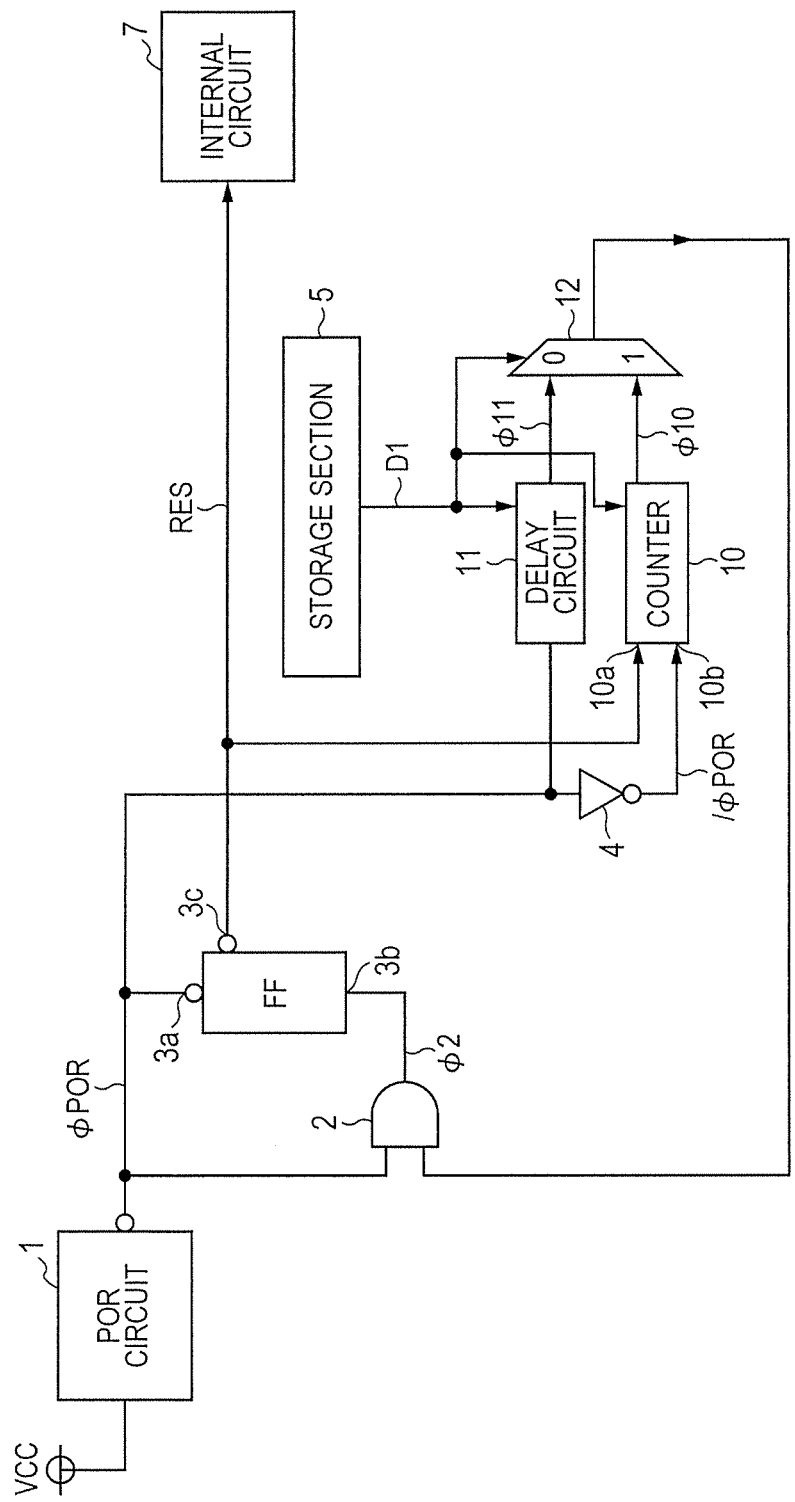
FIG. 5 is a circuit block diagram illustrating a modification to the first embodiment.

FIG. 5 is a circuit block diagram illustrating a modification to the first embodiment in contrast with FIG. 1. As shown in FIG. 5, this modification is different from the semiconductor device in FIG. 1 in that: the counter 6 is replaced with a counter 10, a delay circuit 11, and a selector 12.

The counter 10 is activated when the data signal D1 is at "1" and starts to count when both the signals RES and /ØPOR are brought to the "L" level. When the count value C reaches the maximum value CMH, the counter raises the signal Ø10 from the "L" level to the "H" level. The count time of the counter 10 is set to a time slightly longer than the time T1 in FIG. 3. When the data signal D1 is at "0," the counter 10 is deactivated and does not operate.

When the data signal D1 is at "0," the delay circuit 11 is activated and generates a signal Ø11 by delaying the power on reset signal ØPOR by a relatively short time. The delay time of the delay circuit 11 is set to a time slightly longer than the time T2 in FIG. 4. When the data signal D1 is at "0," the counter 10 is deactivated and does not operate. The delay circuit 11 includes series-connected inverters in even levels.

When the data signal D1 is at "0," the selector 12 selects the output signal Ø11 of the delay circuit 11 and supplies it to the other input node of the AND gate 2; when the data signal D is at "1," the selector selects the output signal Ø10 of the counter 10 and supplies it to the other input node of the AND gate 2. Also in this modification, the same effect as in the first embodiment is obtained.

Second Embodiment

Figure 6:
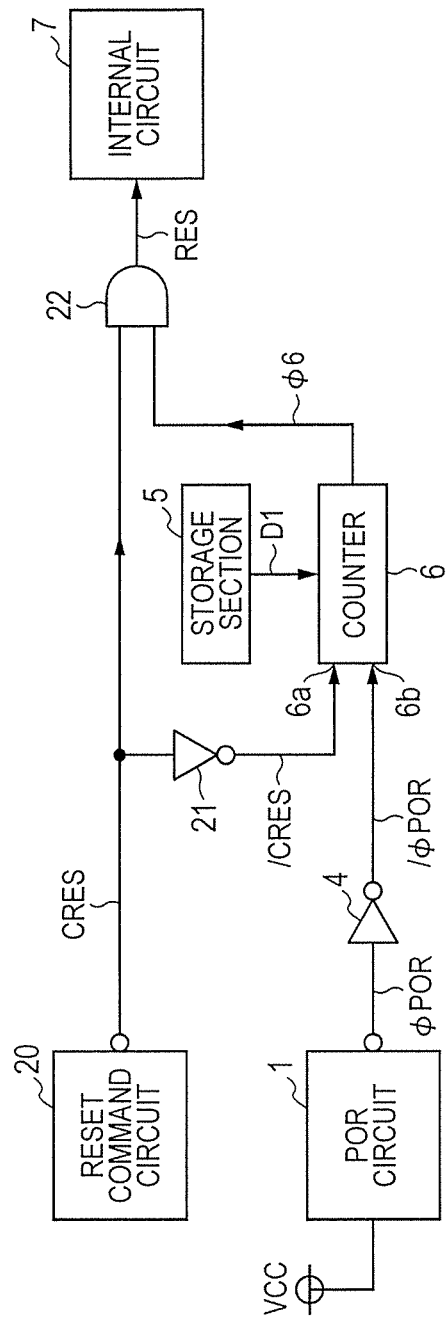
FIG. 6 is a circuit block diagram illustrating a principal part of a semiconductor device in a second embodiment of the invention.

FIG. 6 is a circuit block diagram illustrating a principal part of a semiconductor device in the second embodiment of the invention in contrast with FIG. 1. As shown in FIG. 6, this semiconductor device is different from the semiconductor device in FIG. 1 in that: the AND gate 2 and the flip flop 3 are removed and a reset command circuit 20, an inverter 21, and an AND gate 22 are added.

When a reset of the internal circuit 7 is instructed by an external signal, software, or the like, the reset command circuit 20 brings the reset command signal CRES to the "L" level, or the activation level, only for a predetermined time. The reset command signal CRES is inverted by the inverter 21 and supplied to the stop terminal 6a of the counter 6. Therefore, when the inverted signal /CRES of the reset command signal CRES is caused to fall from the "H" level to the "L" level, the counting operation of the counter 6 is enabled. The AND gate 22 supplies the logical multiplication signal of the reset command signal CRES and the output signal Ø6 of the counter 6 to the internal circuit 7 as the internal reset signal RES.

Figure 7:
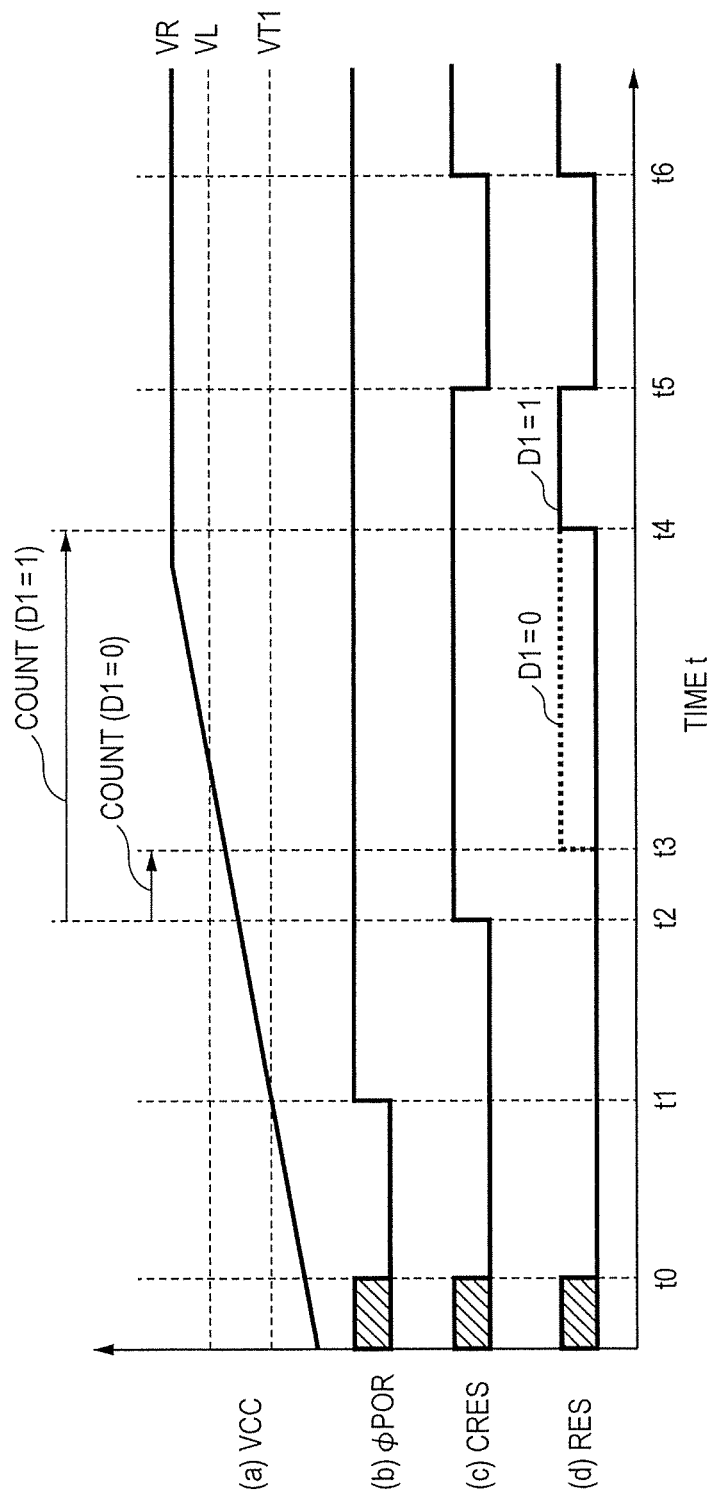
FIG. 7 is a time chart indicating the operation of the semiconductor device illustrated in FIG. 6.

In FIG. 7, (a) to (d) are a time chart indicating the operation of the semiconductor device. As indicated by (a) to (d) of FIG. 7, the semiconductor device operates as follows: when the power is turned on, the power on reset signal ØPOR is brought to the "L" level, or the activation level, and the reset command signal CRES is brought to the "L" level, or the activation level, only for a certain time (time t0 to t2). Even after the supply voltage VCC is raised to the rated voltage VR, the internal circuit 7 may be forcedly reset by the reset command signal CRES (time t5 to t6).

When the power is turned on, the supply voltage VCC is increased, and the operations of the POR circuit 1 and the reset command circuit 20 are enabled, the following processing is carried out: the power on reset signal ØPOR and the reset command signal CRES are caused to fall to the "L" level, or the activation level (time t0). As a result, the internal reset signal RES is caused to fall to the "L" level and the internal circuit 7 is reset to the initial state.

Further, the signal /CRES supplied to the stop terminal 6a of the counter 6 is brought to the "H" level and the counting operation of the counter 6 is held in the stopped state. In addition, the signal /ØPOR supplied to the reset terminal 6b of the counter 6 is brought to the "H" level and the count value C on the counter 6 is reset and fixed to the initial value.

When the supply voltage VCC is further increased and reaches the threshold voltage VT1 of the POR circuit 1, the power on reset signal ØPOR is raised from the "L" level to the "H" level (time t1). As a result, the signal /ØPOR in FIG. 6 is caused to fall from the "H" level to the "L" level and the count value on the counter 6 shifts from the state in which it is fixed at the initial value to the state in which the counter 6 can count.

When the reset command signal CRES is raised to the "H" level, the signal /CRES in FIG. 6 is caused to fall to the "L" level and the counting operation of the counter 6 is started (time t2). When the data signal D1 is at "0," the maximum value CM of the count value C on the counter 6 is a relatively small value CML; when the data signal D1 is at "1," it is a relatively large value CMH. The drawing indicates a case where the data signal D1 is brought to "1" since the rise time of the supply voltage VCC is long.

The supply voltage VCC is further increased and exceeds the lower limit value VL at which the internal circuit 7 normally operates and reaches the rated voltage VR. When the count value C on the counter 6 reaches the maximum value CMH, the signal Ø6 is brought to the "H" level and the internal reset signal RES is raised to the "H" level. When the internal reset signal RES is brought to the "H" level, the reset of the internal circuit 7 is canceled and the operation of the internal circuit 7 is started.

In this case, the maximum value CMH of the count value C on the counter 6 is preset so that after the supply voltage VCC exceeds the operation lower-limit voltage VL, the count value C becomes equal to the maximum value CMH. When the rise time of the supply voltage VCC is short, the maximum value CM of the count value C is set to a small value CML and the internal reset signal RES is early raised to the "H" level (time t3).

After the supply voltage VCC becomes equal to the rated voltage VR, the power on reset signal ØPOR is at the "H" level and the signal /ØPOR is at the "L" level; therefore, the counter 6 is not reset and the output signal Ø6 of the counter 6 is at the "H" level. After the supply voltage VCC becomes equal to the rated voltage VR, consequently, the reset command signal CRES passes through the AND gate 22 and becomes the internal reset signal RES (time t5 to t6). This is because the supply voltage VCC has already reached the rated voltage VR and thus it is unnecessary to delay canceling a reset of the internal circuit 7 as when the power is turned on.

When the reset command signal CRES is fixed at the "H" level, or the deactivation level, the stop terminal 6a of the counter 6 is fixed at the "L" level and the counter 6 is brought into a state in which it can count. When the power on reset signal ØPOR is brought to the "L" level at power-on, the count value C on the counter 6 is reset to the initial value.

When the power on reset signal ØPOR is brought to the "H" level, the counting operation of the counter 6 is started. When the count value C reaches the maximum value CML or CMH, the signal Ø6 is raised from the "L" level to the "H" level. As a result, the internal reset signal RES is raised from the "L" level to the "H" level and the reset of the internal circuit 7 is canceled and the operation of the internal circuit 7 is started. Therefore, when the reset command signal CRES is fixed at the "H" level, this semiconductor device operates similarly to the semiconductor device in the first embodiment.

Third Embodiment

Figure 8:
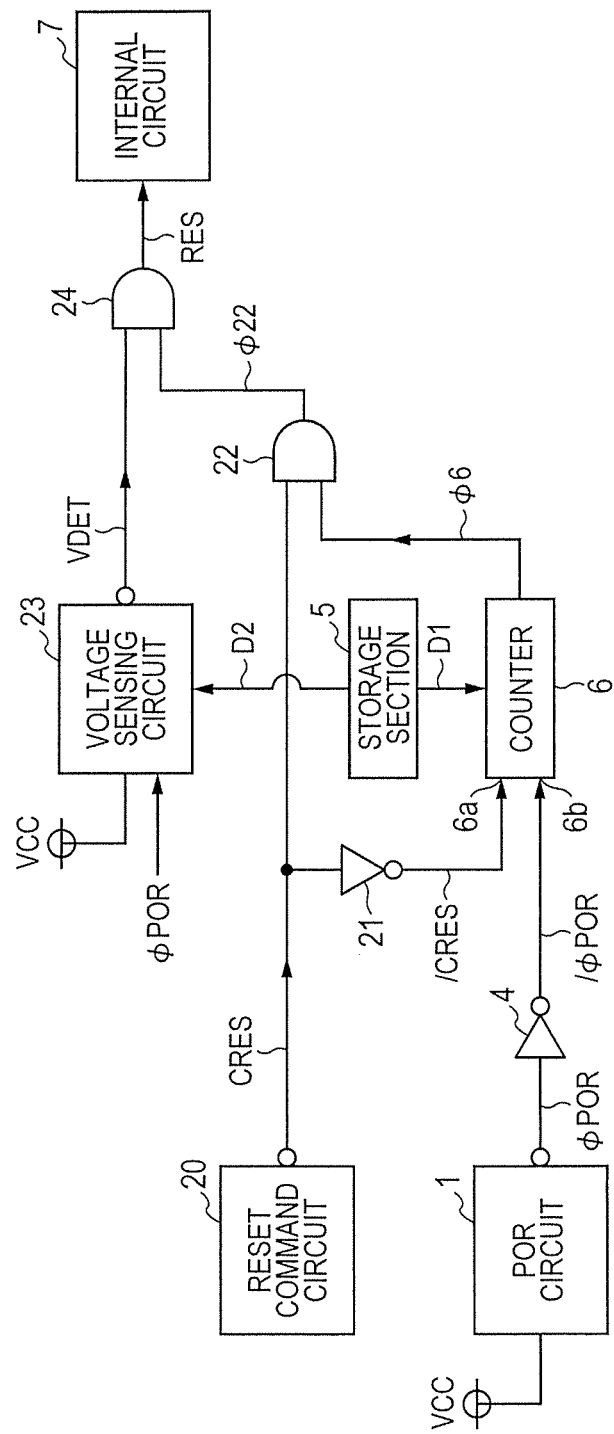
FIG. 8 is a circuit block diagram illustrating a principal part of a semiconductor device in a third embodiment of the invention.

FIG. 8 is a circuit block diagram illustrating a principal part of a semiconductor device in the third embodiment of the invention in contrast with FIG. 6. As shown in FIG. 8, this semiconductor device is different from the semiconductor device in FIG. 6 in that: a voltage sensing circuit 23 and an AND gate 24 are added and the storage section 5 supplies a data signal D2 to the voltage sensing circuit 23. The AND gate 24 supplies the logical multiplication signal of the output signal VDET of the voltage sensing circuit 23 and the output signal Ø22 of the AND gate 22 to the internal circuit 7 as the internal reset signal RES. To disable the voltage sensing circuit 23, the data signal D2 of "0" is stored in the storage section 5; to enable the voltage sensing circuit 23, the data signal D2 of "1" is stored in the storage section 5.

The voltage sensing circuit 23 is started when the data signal D2 is at "1" after the power on reset signal ØPOR is raised from the "L" level to the "H" level. When the data signal D2 is at "0," the voltage sensing circuit 23 is not started. The voltage sensing circuit 23 has a threshold voltage VT2 between the operation lower-limit voltage VL and the rated voltage VR. It compares the supply voltage VCC with the threshold voltage VT2 for their levels and outputs a voltage sensing signal VDET indicating the result of the comparison. When the supply voltage VCC is lower than the threshold voltage VT2, the voltage sensing signal Ø23 is brought to the "L" level, or the activation level; when the supply voltage VCC is higher than the threshold voltage VT2, the voltage sensing signal Ø23 is brought to the "H" level, or the deactivation level.

The voltage sensing circuit 23 is not stabilized and cannot accurately sense voltage until it stands by for a predetermined time after it is started. When the data signal D2 is at "1," consequently, the data signal D1 is brought to "0" and the counter 6 is started in response to the reset command signal CRES being raised from the "L" level to the "H" level. Until the count value C on the counter 6 reaches the maximum value CML, the signal Ø6 is kept at the "L" level and the internal reset signal RES is fixed at the "L" level. Thus it is possible to keep the internal reset signal RES at the "L" level until the voltage sensing circuit 23 is stabilized and prevent the reset of the internal circuit 7 from being erroneously canceled.

When the data signal D2 is at "0," the voltage sensing circuit 23 is not started. In this case, the voltage sensing signal VDET is brought to the "H" level, or the deactivation level and the configuration of the semiconductor device in FIG. 8 is the same as the configuration of the semiconductor device in FIG. 6.

The microcomputer is usually equipped with a voltage sensing circuit for sensing that the supply voltage VCC has become lower than the threshold voltage VT2 and carrying out a reset and interrupt operation. Therefore, when the internal circuit 7 is a microcomputer, its voltage sensing circuit can also be used as the above voltage sensing circuit 23.

Figure 9:
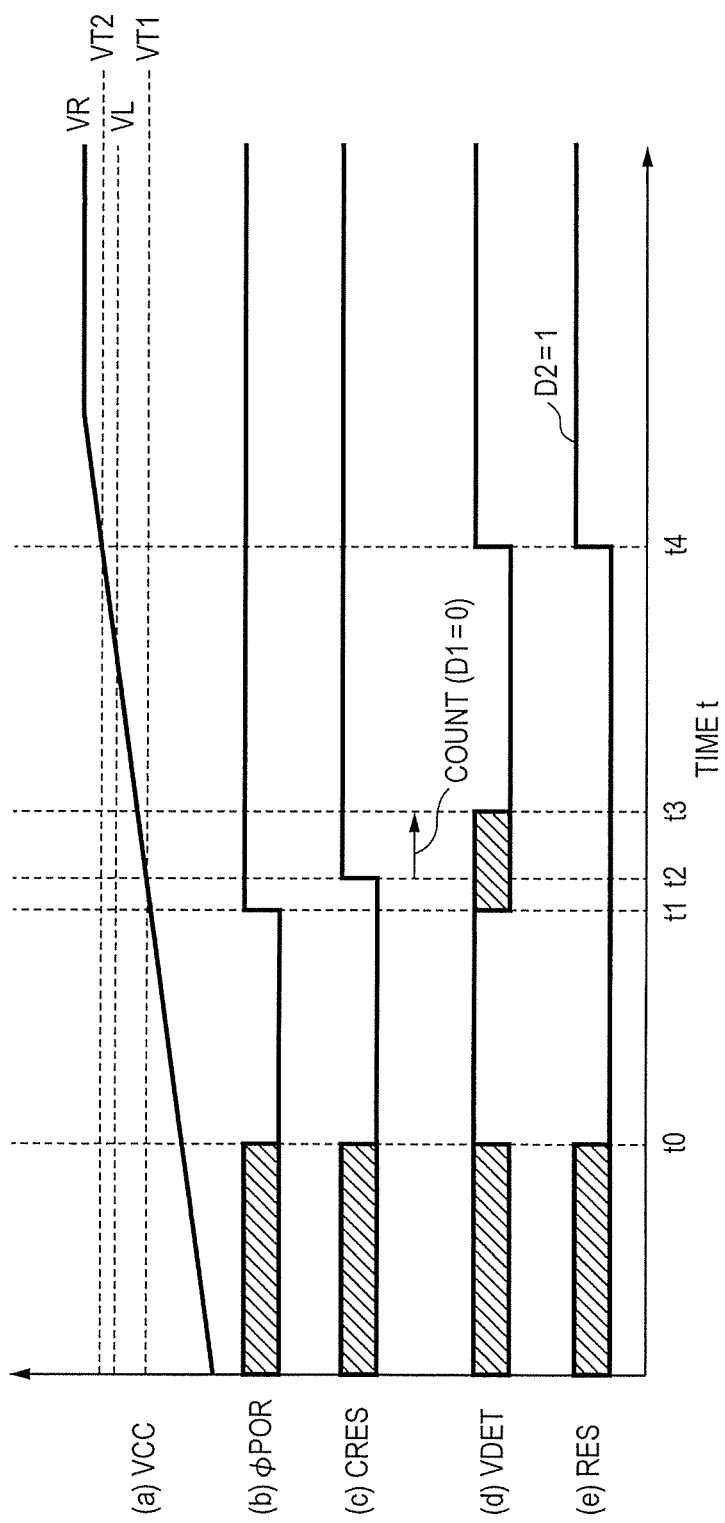
FIG. 9 is a time chart indicating the operation of the semiconductor device illustrated in FIG. 8.

In FIG. 9, (a) to (e) are a time chart indicating the operation of the semiconductor device illustrated in FIG. 8. As indicated by (a) to (e) of FIG. 9, when the power is turned on, the supply voltage VCC is increased and the POR circuit 1, reset command circuit 20, and voltage sensing circuit 23 become operable. As a result, the power on reset signal ØPOR and the reset command signal CRES are brought to the "L" level, or the activation level, and the voltage sensing signal VDET is brought to the "H" level, or the deactivation level (time t0). Consequently, the internal reset signal RES is caused to fall to the "L" level and the internal circuit 7 is reset to the initial state.

Further, the signal /CRES supplied to the stop terminal 6a of the counter 6 is brought to the "H" level and the counting operation of the counter 6 is held in the stopped state. In addition, the signal /ØPOR supplied to the reset terminal 6b of the counter 6 is brought to the "H" level and the count value C on the counter 6 is reset and fixed to the initial value.

When the supply voltage VCC is further increased and reaches the threshold voltage VT1 of the POR circuit 1, the power on reset signal ØPOR is raised from the "L" level to the "H" level (time t1). As a result, the signal /ØPOR in FIG. 8 is caused to fall from the "H" level to the "L" level and the count value on the counter 6 shifts from the state in which it is fixed at the initial value to the state in which the counter 6 can count. Further, whether the voltage sensing circuit 23 is enabled or disabled is determined based on the data signal D2. Here, (a) to (e) of FIG. 9 indicate a case where the data signal D2 is at "1" and the voltage sensing circuit 23 is enabled. Since the data signal D2 is at "1," the data signal D1 is automatically brought to "0" and the maximum value CM of the count value C on the counter 6 is set to a relatively small value CML.

When the reset command signal CRES is raised to the "H" level, the signal /CRES in FIG. 6 is caused to fall to the "L" level and the counting operation of the counter 6 is started (time t2). Until the count value C on the counter 6 reaches the maximum value CML, the output signal Ø6 of the counter 6 is brought to the "L" level and the internal reset signal RES is fixed at the "L" level. That is, during a period for which the counter 6 is performing counting operation, the internal reset signal RES is fixed at the "L" level regardless of the level of the voltage sensing signal VDET (time t2 to t3).

When the count value C on the counter 6 reaches the maximum value CML (time t3), the output signal Ø6 of the counter 6 is brought to the "H" level and the output signal Ø22 of the AND gate 22 is brought to the "H" level. The voltage sensing signal VDET passes through the AND gate 24 and becomes the internal reset signal RES.

When the supply voltage VCC is increased and reaches the threshold voltage VT2 of the voltage sensing circuit 23, the following processing is carried out: the voltage sensing signal VDET is raised to the "H" level, the internal reset signal RES is raised to the "H" level, and the reset of the internal circuit 7 is canceled (time t4).

When the data signal D2 is at "0," the voltage sensing signal VDET is fixed at the "H" level and the semiconductor device in FIG. 8 operates similarly to the semiconductor device in FIG. 6. Therefore, the description thereof will not be repeated.

In the third embodiment, the following can be implemented by selecting whether to enable or disable the voltage sensing circuit 23: the optimum reset operation can be implemented according to the used supply voltage VCC or the rise time of supply voltage VCC at power-on. As a result, a single semiconductor device (for example, a microcomputer) can be applied to a wide variety of applications.

More specific description will be given. To advance start of the operation of the semiconductor device, a wasteful wait time can be reduced by taking the following measure: the rise time of supply voltage VCC is shortened, the voltage sensing circuit 23 is disabled, and the count time of the counter 6 is shortened. As a result, it is possible to frequently turn on and off the power supply to the semiconductor device and reduce the power consumption of the system.

To start to use the semiconductor device at a relatively high supply voltage VCC, the voltage sensing circuit 23 is enabled. Thus a wasteful wait time can be reduced without depending on the rise time of supply voltage VCC.

The following can be implemented by disabling the voltage sensing circuit 23 after the supply voltage VCC reaches the rated voltage VR: the semiconductor device can be used until the supply voltage VCC drops to the operation lower-limit voltage VL. This is suitable for cases where supply voltage VCC is supplied by a battery. More specific description will be given. Since the battery voltage is high in the initial stage, the supply voltage VCC is raised without constraints such as the rise time of the supply voltage VCC. Even after the battery begins to be exhausted, the operation of the semiconductor device can be continued until the operation lower-limit voltage VL is reached.

The supply voltage VCC is slowly raised. When low-voltage operation is required from the beginning, the internal circuit 7 can be prevented from malfunctioning under the constraints of the rise time of supply voltage VCC by taking the following measure: the voltage sensing circuit 23 is disabled and reset canceling is delayed by the counter 6. This is a setting effective for cases where power consumption is reduced by using an accurate power supply and constantly operating the semiconductor device in proximity to the operation lower-limit voltage VL.

Up to this point, the invention made by the present inventors has been described based on embodiments. The invention is not limited to the above embodiments and can be variously modified without departing from the scope of the invention, needless to add.

What is claimed is:

1. A semiconductor device comprising:
   a power-on-reset circuit that sets an internal reset signal to reset an internal circuit when a power supply voltage is lower than a threshold voltage, and
   a storage unit that stores a value indicating a rise time of the power supply voltage, wherein
   when the semiconductor device receives an external reset signal which indicates an inactive value and the power supply voltage is equal to or higher than the threshold voltage, the internal reset signal is cancelled after a period since the power supply voltage reaches the threshold voltage passes, the period being determined in accordance with the value.

2. The semiconductor device according to claim 1, wherein when the external reset signal indicates an active value after the cancellation of the internal reset signal, the internal reset signal is set and cancelled without a delay in accordance with the value.

3. The semiconductor device according to claim 1, wherein when the external reset signal indicates an active value after the power supply voltage is equal to or higher than the threshold voltage, the internal reset signal is cancelled after the period since the external reset signal turns to an inactive value from the active value passes.

4. The semiconductor device according to claim 1, wherein the storage unit is a flash memory.

5. The semiconductor device according to claim 1, the value is readable when the power supply voltage is equal to or higher than the threshold voltage.

6. The semiconductor device according to claim 1, further comprising a delay circuit to cancel the internal reset signal after the period.

* * * * *